(12) United States Patent
Sobolewski

(10) Patent No.: US 11,705,894 B2
(45) Date of Patent: Jul. 18, 2023

(54) PULSED HIGH CURRENT TECHNIQUE FOR CHARACTERIZATION OF DEVICE UNDER TEST

(71) Applicant: Keithley Instruments, LLC, Solon, OH (US)

(72) Inventor: Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 209 days.

(21) Appl. No.: 17/001,526

(22) Filed: Aug. 24, 2020

(65) Prior Publication Data

US 2021/0067147 A1   Mar. 4, 2021

Related U.S. Application Data

(60) Provisional application No. 62/892,450, filed on Aug. 27, 2019.

(51) Int. Cl.
| | | |
|---|---|---|
| *G01R 31/02* | (2006.01) | |
| *G01R 31/26* | (2020.01) | |
| *H03K 3/57* | (2006.01) | |
| *G01R 31/319* | (2006.01) | |
| *G01R 31/28* | (2006.01) | |
| *H01L 21/66* | (2006.01) | |

(52) U.S. Cl.
CPC .......... *H03K 3/57* (2013.01); *G01R 31/2831* (2013.01); *G01R 31/2886* (2013.01); *G01R 31/31924* (2013.01); *G01R 31/2884* (2013.01); *H01L 22/34* (2013.01); *H01L 2924/00* (2013.01); *H01L 2924/0002* (2013.01)

(58) Field of Classification Search
CPC ............... H03K 3/57; G01R 31/31924; G01R 31/2603; G01R 31/2621; G01R 1/28; G01R 31/2884; G01R 31/2886; G01R 31/2831; H01L 2924/00; H01L 2924/0002; H01L 22/34
USPC ......... 324/71, 378, 403, 415, 425, 500, 537, 324/762.01
See application file for complete search history.

(56) References Cited

U.S. PATENT DOCUMENTS

| | | | |
|---|---|---|---|
| 2005/0128655 A1* | 6/2005 | Cuevas | G01R 31/2841 361/18 |
| 2007/0279081 A1* | 12/2007 | Okawa | G01R 31/2603 324/762.09 |
| 2008/0116899 A1* | 5/2008 | Mitsuhashi | G01R 31/31917 324/537 |
| 2009/0160477 A1* | 6/2009 | Agarwal | G01R 31/2884 324/537 |
| 2011/0018559 A1* | 1/2011 | Hashimoto | G11C 29/56 324/140 R |
| 2013/0181525 A1* | 7/2013 | de Jesus | H02M 3/335 307/43 |
| 2015/0032393 A1* | 1/2015 | Sri | G01R 31/26 702/58 |

(Continued)

*Primary Examiner* — Raul J Rios Russo
(74) *Attorney, Agent, or Firm* — Miller Nash LLP; Andrew J. Harrington

(57) ABSTRACT

A test and measurement circuit including a capacitor in parallel with a device under test, a direct current voltage source configured to charge the capacitor, a pulse generator configured to generate a pulse for testing the device under test, and a sensor for determining a current in the device under test.

20 Claims, 8 Drawing Sheets

(56) References Cited

U.S. PATENT DOCUMENTS

| | | | |
|---|---|---|---|
| 2015/0377951 A1* | 12/2015 | Chang | G01R 31/2875 |
| | | | 324/762.05 |
| 2018/0188312 A1* | 7/2018 | Yanagi | G06F 30/367 |
| 2019/0067056 A1* | 2/2019 | Shen | G01R 3/00 |
| 2021/0132136 A1* | 5/2021 | Yanagi | G06F 30/367 |

* cited by examiner

PULSED HIGH CURRENT TECHNIQUE FOR CHARACTERIZATION OF DEVICE UNDER TEST

PRIORITY

This disclosure claims benefit of U.S. Provisional Application No. 62/892,450, titled "PULSED HIGH CURRENT TECHNIQUE FOR CHARACTERIZATION OF A DEVICE UNDER TEST," filed on Aug. 27, 2019, which is incorporated herein by reference in its entirety.

TECHNICAL FIELD

This disclosure is directed to systems and methods related to test and measurement systems, and in particular, to systems and methods for performing device characterization of a device under test.

BACKGROUND

Device characterization, such as characterization of a semiconductor device, e.g., a power Metal-Oxide-Semiconductor Field-Effect Transistor (MOSFET), may involve applying voltages to the terminals of the device, and measuring the resulting currents that flow through the device. Such device characterization may include the generation of a plot of current versus voltage called an I/V curve or an I/V sweep.

Conventional systems and methods for characterizing a device under test generally rely on direct current (DC) sourcing instruments, such as source measure units (SMUs), to apply voltages to the device under test and perform measurements while voltages are applied. As the current increases, the DC voltages are applied over shorter time frames to limit power dissipation in the device under test. However, such testing methods run into measurement instrument power limitations at high currents, as well as device under test power dissipation limitations. Further, high current delivery can become very difficult through a cabled system due to resistive losses and inductive voltage drops.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
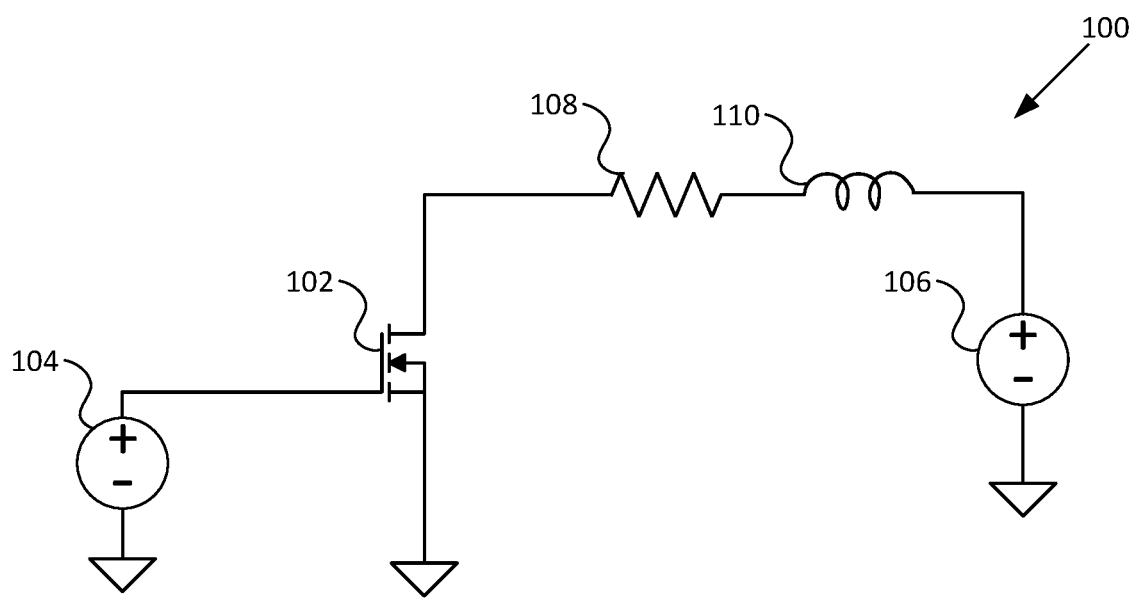
FIG. 1 is an example of a conventional measurement circuit for characterizing a device under test.

FIG. 1 illustrates a conventional measurement circuit 100 for characterizing a device under test 102. In the circuit 100 of FIG. 1, the device under test 102 is a transistor. Voltage is applied to the device under test 102 at the gate by a DC voltage source 104 and at the drain by another DC voltage source 106. The circuit 100 also includes a setup resistor 108 and a setup inductor 110. In some cases, the illustrated setup resistor 108 and setup inductor 110 can represent parasitic elements of one or more components of the measurement circuit 100. When the voltages are applied to the gate and drain of the device under test 102, the current can be measured across the setup resistor 108 to determine the characterizations of the device under test. However, as discussed above, the circuit 100 runs into instrument power limitations at high currents and due to this it can be difficult to characterize the device under test 102 at these high currents.

When high current characterization is needed, then the conventional measurement circuit 100 becomes impractical. Resistive drop, inductive limitation, power line limits, and device under test power dissipation all become difficult to overcome. Embodiments of the disclosure, as discussed in more detail below, can overcome these difficulties by placing an energy storage device close to the device under test, optimizing circuit connections and layout to minimize series resistance and inductance, using fast data acquisition over a required device under test operating range, and letting the device under test set the operating point and IV sweep.

Figure 2:
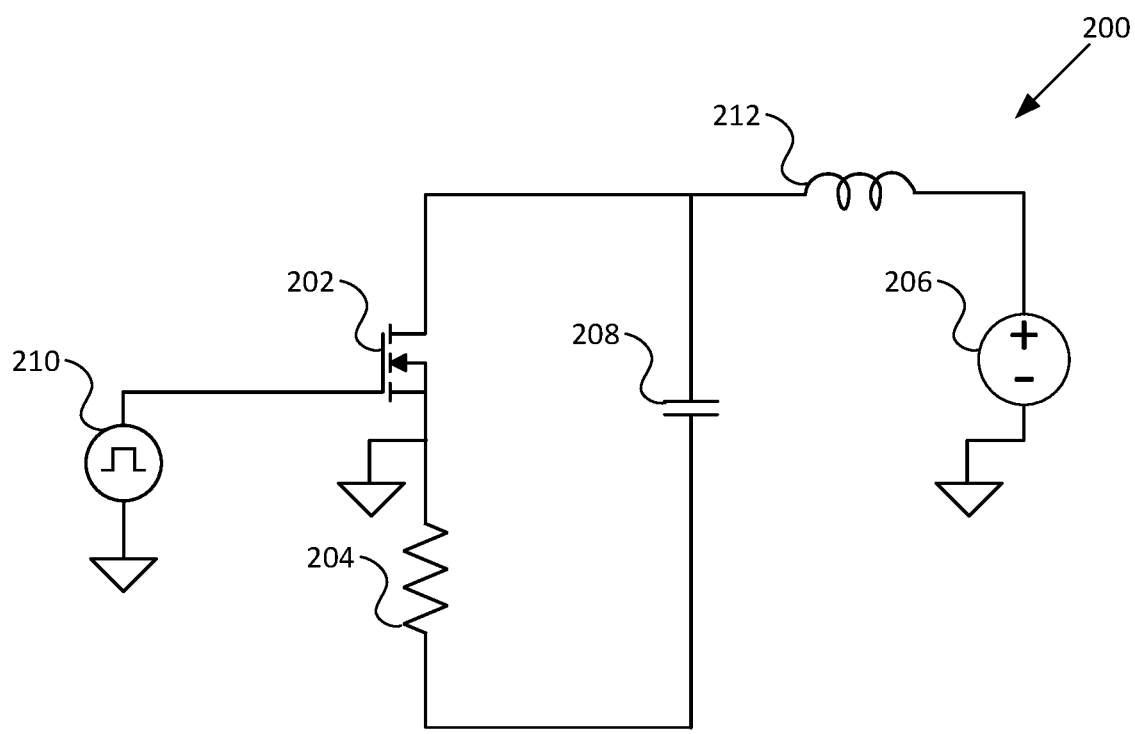
FIG. 2 is an example of a measurement circuit for characterizing a device under test according to some embodiments of the disclosure.

FIG. 2 illustrates an example measurement circuit 200 according to some embodiments of the disclosure. The measurement circuit 200 for characterizing a device under test 202 includes a sensor 204 for measuring drain current of the device under test 202. The sensor 204, may be, for example, a resistor and associated sensing circuitry. The measurement circuit 200 also includes a DC power supply 206 for charging a local capacitor 208. The DC power supply 206 may be included in a test and measurement instrument, such as a source measure unit, or may be included as a separate DC power supply. The measurement circuit 200 also includes a pulse generator 210 and an inductor 212. In some embodiments, the illustrated inductor 212 can represent parasitic elements of one or more components of the measurement circuit 200.

The local capacitor 208 is physically located near the device under test 202, while the DC power supply 206 may be remote from the device under test 202. The local capacitor 208 is charged by the DC power supply 206 to a predetermined voltage. The predetermined voltage may be set at the DC power supply 206 by a user in some embodiments. The predetermined voltage can be the highest drain to source voltage ($V_{DS}$) that should be tested or used across the drain to source of the device under test 202.

When the local capacitor 208 is fully charged to the predetermined voltage, the pulse generator 210 generates a pulse at a specific or known voltage which is received at the gate, or a similar control terminal, of the device under test 202. When the gate of the device under test 202 receives the pulse from the pulse generator 210, the device under test 202 discharges the energy stored in the local capacitor 208. As the local capacitor 208 is discharging, a test and measurement instrument can measure the voltage and current relationship in the device under test 202 by testing the current through the sensor 204 as well as the voltage across the device under test 202. The test and measurement instrument can be any test and measurement instrument that can measure the current and voltage, including, but not limited to, a high-speed digitizing circuit or an oscilloscope.

The measurement circuit 200 of FIG. 2 can deliver, for example, a 20 Volt to 50 Volt open circuit and 4000 Amperes to 10,000 Amperes of short circuit current. These voltage and current ranges are merely examples. Embodiments of the invention are not limited to these example ranges. The high current flow through the measurement circuit 200 is limited to a tight loop between the device under test 202, the local capacitor 208, and the sensor 204.

In some embodiments, the gate voltage can be pulsed with the pulse from the pulse generator 210 with respect to the source voltage to eliminate gate voltage dependence on the device under test 202 current flow. When the pulse is wide, the DC power supply 206 voltage will interact with the drain current flow unless it floats with respect to measurement circuit 200. In such a situation, the test and measurement instrument would need both the drain current and the current measured at the sensor 204 to be measured to arrive at the correct current value.

In some embodiments, the sensor 204 may be located on the drain or HI side, rather than the source or LO side, of the device under test 202.

Figure 3:
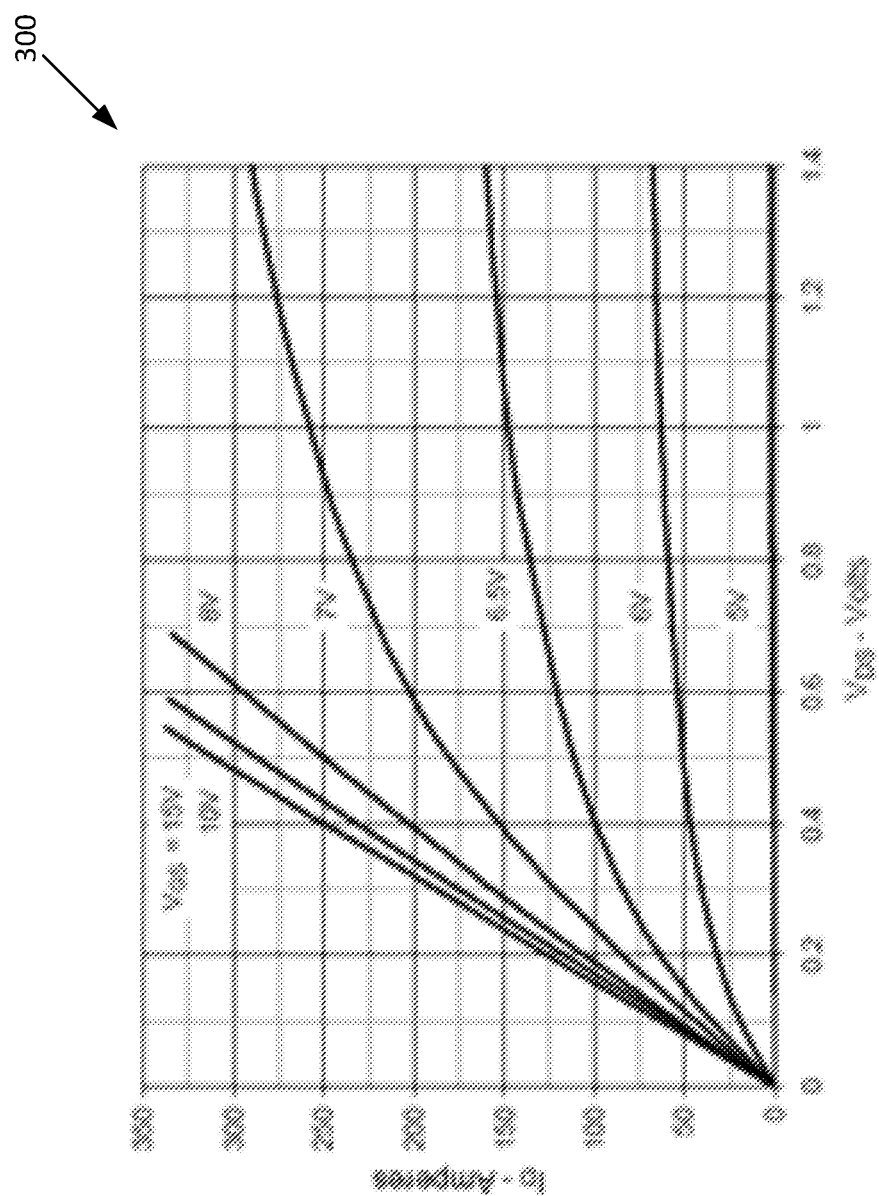
FIGS. 3 and 4 are examples of a conventional current versus voltage curve by a manufacturer of a device under test.
Figure 4:
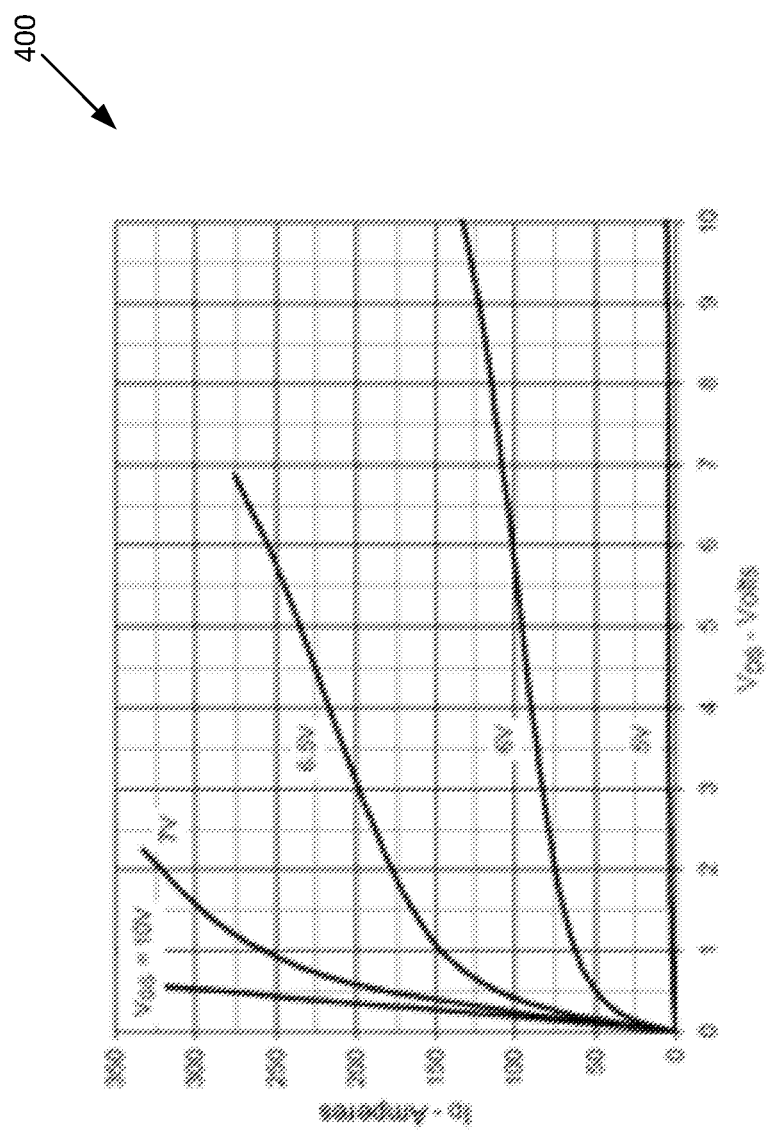

Due to the limited testing or characterization abilities of conventional test and measurement circuits, such as the measurement circuit 100 shown in FIG. 1, device under test manufacturers, such as semiconductor manufacturers, often are only able to provide a limited characterization of the semiconductor devices, as illustrated in FIGS. 3 and 4. FIG. 3 illustrates a set of IV curves 300 only up to 1.4 Volts for a drain source voltage ($V_{DS}$) and 350 Amperes, while FIG. 4 illustrates a set of IV curves 400 up to 10 Volts for $V_{DS}$ and 350 Amperes. Each curve of the set of IV curves 300 and 400 illustrates a different gate-source voltage ($V_{GS}$) applied at the gate. The devices under test are not easily able to be characterized at currents higher than 350 Amperes accurately.

Figure 5:
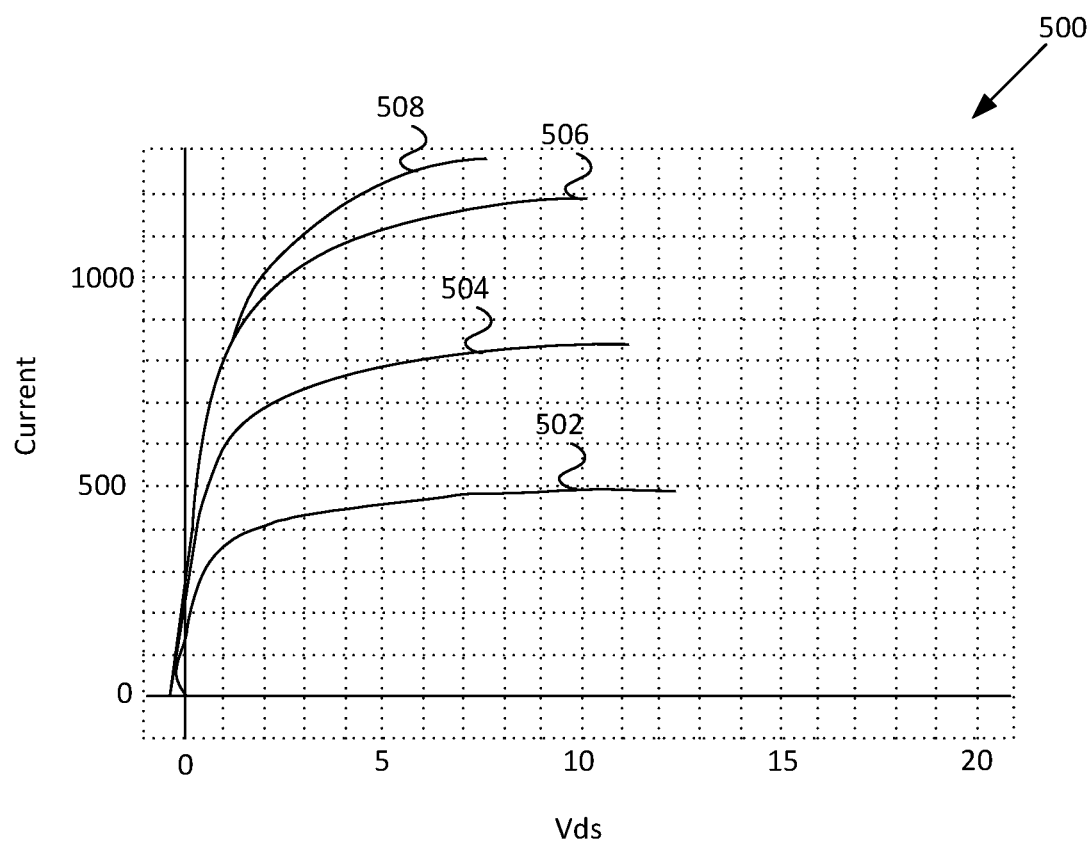
FIG. 5 is an example of a current versus voltage curve determined by the measurement circuit of FIG. 1.

FIG. 5, however, illustrates an example of a set of IV curves 500 obtained from characterizing a device under test by measurement circuit 200. Using embodiments of the disclosure, the IV curves 500 can be obtained up to a much higher drain-source voltages (Vds), and much higher currents, such as the 1300 Amperes illustrated in the IV curves 500 of FIG. 5. Each IV curve 502, 504, 506, 508 of the IV curves 500 illustrates the response of the device under test 202 when different voltage pulses, e.g. pulses with different amplitudes, are generated by the pulse generator 210. These voltage and current ranges are merely examples. Embodiments of the disclosure are not limited to these example ranges.

Figure 8:
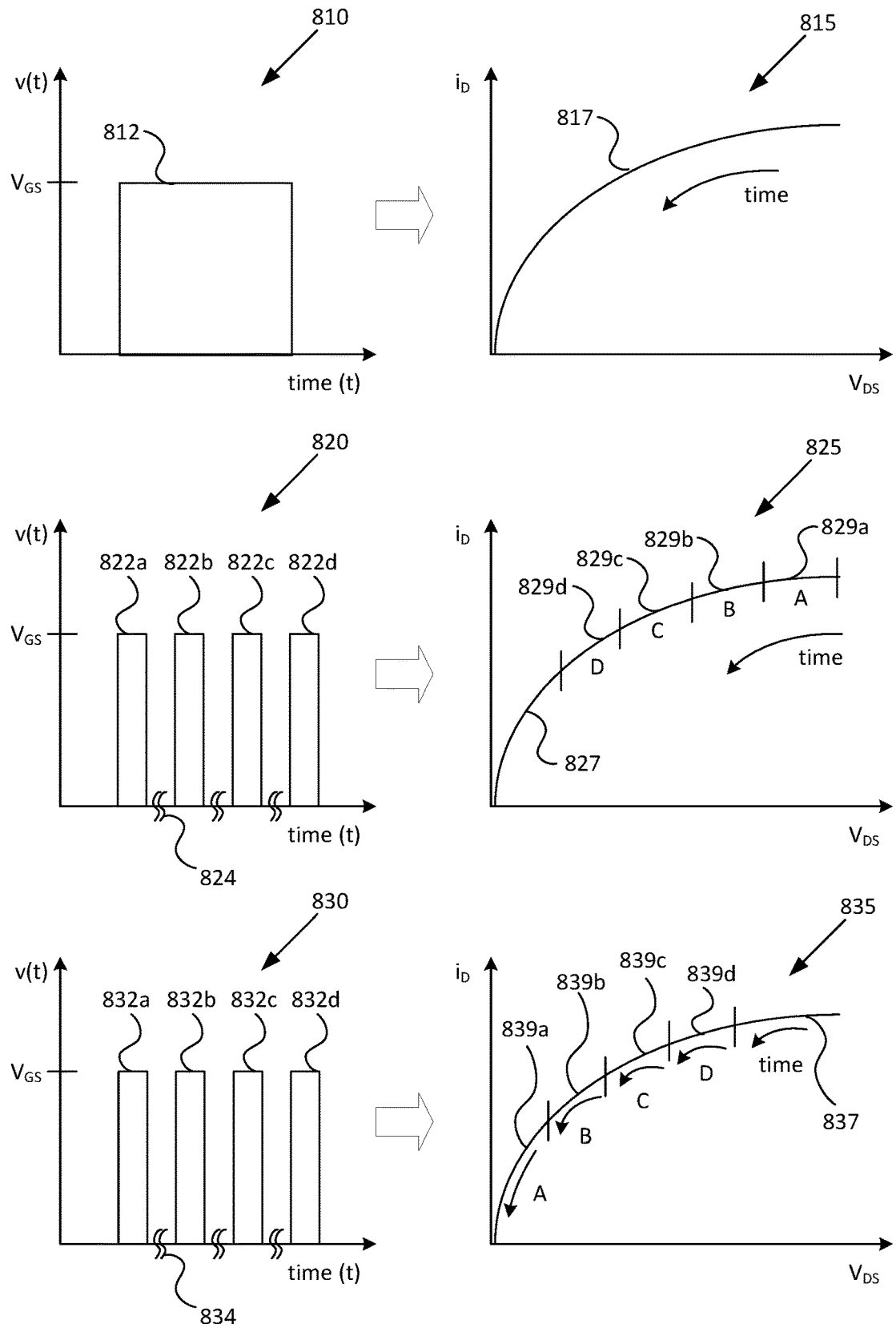
FIG. 8 is an example of alternative techniques for producing a current versus voltage curve for characterizing a device under test according to other embodiments of the disclosure.

According to some embodiments of the disclosure, an IV curve may be generated using a piecemeal or segmented measurement technique, as depicted in FIG. 8 for example. FIG. 8 illustrates three plots 810, 820, 830 of signals 812, 822, 832, such as the voltage signal generated by pulse generator 210 of FIG. 2, which is received at a control terminal of a DUT, such as the gate of DUT 202 in FIG. 2. FIG. 8 also illustrates three plots 815, 825, 835 that correspond to plots 810, 820, 830, respectively. Plot 815 shows an IV curve 817 that is measured in response to the control terminal pulse 812 shown in plot 810. As discussed above, the pulse 812 causes the DUT 202 to turn on, and current through the DUT is measured as the capacitor 208 of FIG. 2 discharges. Thus, the IV curve 817 may be continuously measured and generated in time from high $V_{DS}$ to low $V_{DS}$ as shown by the "time" arrow in plot 815.

In contrast, in plots 820 and 830 of FIG. 8, the control terminal pulses 822a-822d and 832a-832d are much narrower, and may have a delay 824, 834 between each pulse. Each of the narrow pulses 822a-822d may be used to measure and generate a segment A-D of IV curve 827 in plot 825. For example, pulse 822a causes current to flow in the DUT 202, which may be measured as the capacitor 208 discharges, and used to generate segment 829a of IV curve 827. At the end of pulse 822a, the DUT turns off, stopping the current flow. The next pulse 822b again causes current to flow in the DUT 202, which maybe measured as capacitor 208 discharges further, and used to generate segment 829b of IV curve 827. Likewise, IV curve segment 829c corresponds to pulse 822c, and segment 829d corresponds to pulse 822d. Within each segment 829a-829d of the IV curve 827, the current through the DUT is measured in time from high $V_{DS}$ to low $V_{DS}$ as shown by the "time" arrow in plot 825. Plots 830 and 835 depict an alternative embodiment of a segmented technique for generating IV curves. The pulses 832a-832d and delays 834 in plot 830 are similar to the pulses 822a-822d and delays 824 in plot 820. However, in this embodiment, the supply voltage to the DUT, such as the signal from DC power supply 206 in FIG. 2, can be made to be an increasing voltage ramp. Typically, this would be a slowly increasing ramp. Thus, in this embodiment, pulse 832a of plot 830 corresponds to measurement of segment 839a of IV curve 837. Likewise, pulse 832b corresponds to measurement of segment 832b, pulse 832c corresponds to segment 839c, and pulse 832d corresponds to segment 839d. This embodiment allows the IV curve segments 839a-839d to be generated in order from the lower $V_{DS}$ segment 839a to the higher $V_{DS}$ segment 839d. However, within each segment 839a-839d of the IV curve 837, the current through the DUT is still measured in time from high $V_{DS}$ to low $V_{DS}$ as shown by the multiple "time" arrows in plot 835.

Although the description above uses the example of a MOSFET as the device under test 202, embodiments of the disclosure may be used to characterize many other types of devices, including all types of transistors. Moreover, the device under test 202 of embodiments of the disclosure are also not limited to three-terminal devices like transistors, and other types of devices under test 202 may also be tested using a measurement circuit according to embodiments of the disclosure.

Figure 6:
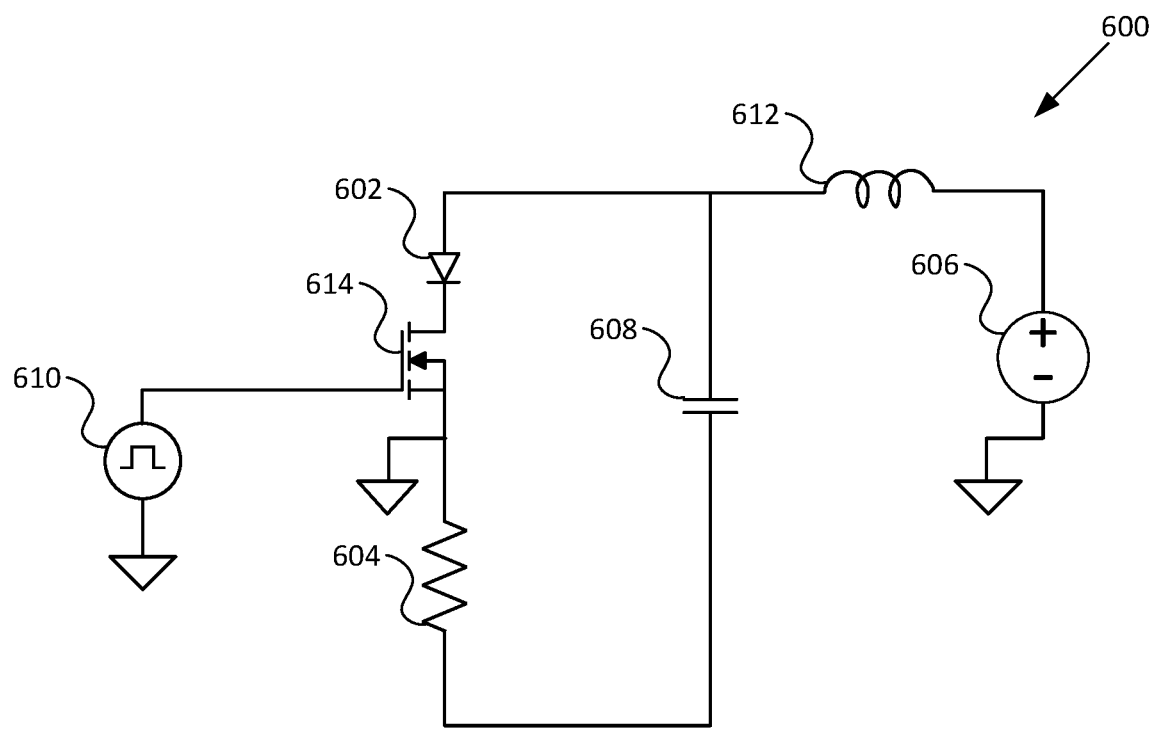
FIG. 6 is another example of a measurement circuit for characterizing a device under test according to other embodiments of the disclosure.

FIG. 6, for example, illustrates a measurement circuit 600 for measuring a two-terminal device under test 602. The measurement circuit 600 includes, similar to measurement circuit 200, a sensor 604, a DC power supply 606, a local capacitor 608, a pulse generator 610, and an inductor 612. Since the measurement circuit 600 is used for measuring a two-terminal device under test 602, such as a diode, a three-terminal switch 614 may be used to facilitate the characterization or testing of the device under test 602.

In the measurement circuit 600 of FIG. 6, the switch 614 is located in series with the device under test 602 on the low side of the device under test 602. However, the switch 602 could be located in series with the device under test 602 on the high side of the device under test 602 in some embodiments.

Similar to the measurement circuit 200 of FIG. 2, a pulse is generated at a particular voltage at the pulse generator 602 to the gate, or control terminal, of the switch 614. As the switch 614 turns on with the pulse, the local capacitor 608 is discharged and current flows through the device under test 602. The current flowing through the device under test 602 can be measured at the sensor 604 while the voltage is measured across the device under test 602. Both the current and the voltage can be measured by a test and measurement instrument, such as a high-speed digitizing circuit or an oscilloscope.

The measured current of the device under test 602 may be used to provide a current limit or an additional regulating device could be used to set a constant voltage or current for a limited time. The limited time can be determined by the local capacitor 608. That is, a current limiter may be added to circuits 200 or 600 to limit the current through the DUT, based on the maximum current the DUT can handle. The maximum DUT current may be entered by a user though a user interface, or may be known from a DUT manufacturer's data sheet. Furthermore, in order for the instrument to test a variety of DUTs with a wide range of maximum currents, circuits 200 or 600 may include a switchable bank of energy storage devices, such as capacitors 208, 608, that may be switched in depending on the maximum current capacity of the DUT.

Figure 7:
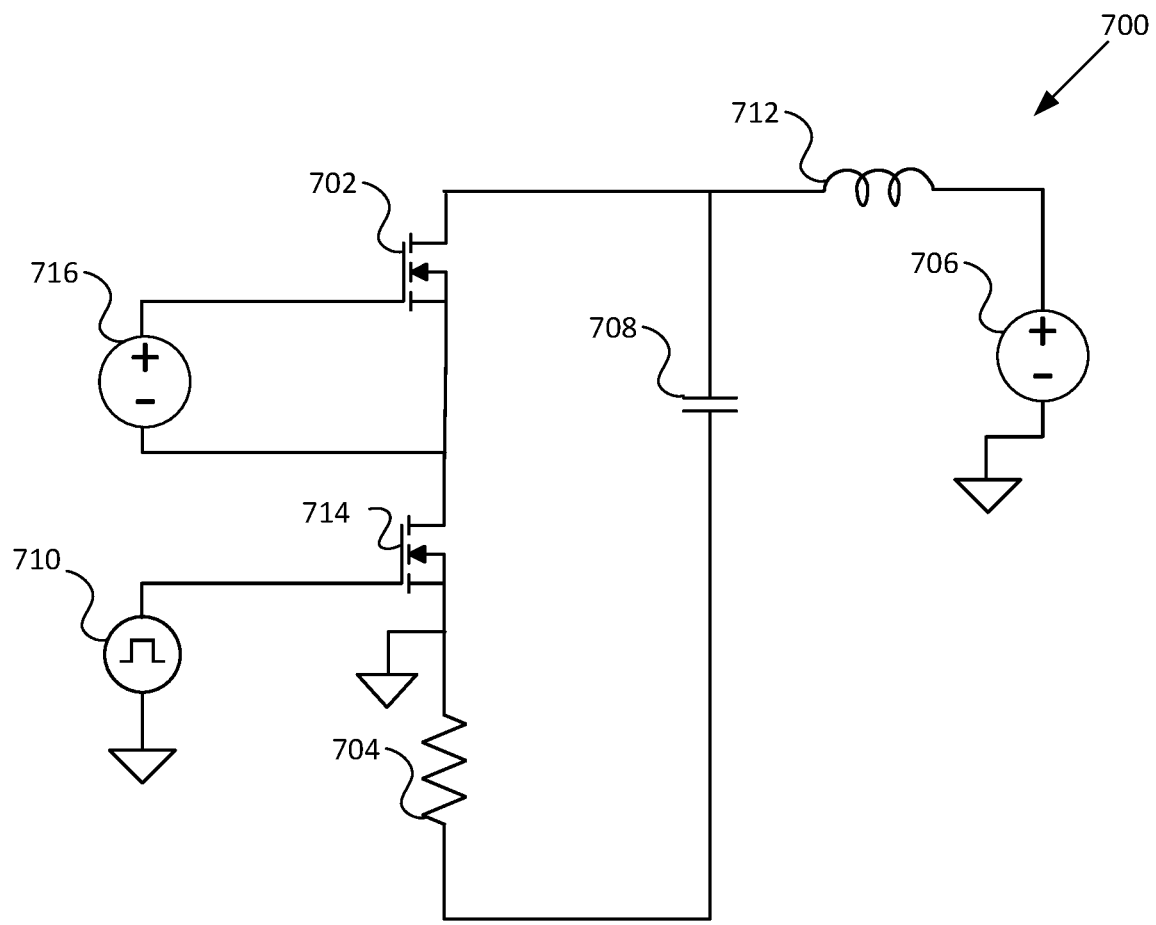
FIG. 7 is another example of a measurement circuit for characterizing a device under test according to other embodiments of the disclosure.

FIG. 7 illustrates a measurement circuit 700, which employs a switch 714, similar to switch 614 in measurement circuit 600, but which may be used to characterize a three-terminal DUT 702, like circuit 200. The current sensor 704, DC power supply 706, capacitor 708, pulse generator 710, and inductor 712 are similar to the current sensor 604, DC power supply 606, capacitor 608, pulse generator 610, and inductor 612 of FIG. 6. Like switch 614, switch 714 receives a pulse control signal from pulse generator 710 to turn the switch on, and cause current to flow in the DUT 702. However, the DUT 702 in FIG. 7 is a three-terminal device, such as a transistor. Measurement circuit 700 also includes a voltage source 716 coupled to the DUT. The voltage source 716 may be used to set a bias voltage of the DUT 702. The bias voltage may either be a DC level, or may also be a pulse, which can be synchronized with the pulse from pulse generator 710. In still other embodiments, the functionality of pulse generator 710 and the voltage source 716 may be swapped. The switch 714 may provide additional control of the test conditions, such as enabling the drain voltage of the device under test while the gate voltage is present on the device under test.

The measurement circuits shown in FIGS. 2, 6 and 7 can be included in a single device or package, including the DC voltage sources 206, 606, 706 and connect directly to the devices under test 202, 602, 702. That is, the measurement circuit will be physically close to the device under test. In other embodiments, the DC voltage sources 206, 606, 706 may be a distance away from the device under test. However, in each embodiment, the capacitors 208, 608, 708 are each provided physically close to the devices under test 202, 602, 702 to minimize series resistance and inductance.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement circuit, comprising a capacitor in parallel with a device under test; a direct current voltage source configured to charge the capacitor; a pulse generator configured to generate a pulse for testing the device under test; and a sensor for determining a current in the device under test.

Example 2 is the test and measurement circuit of Example 1, wherein the capacitor discharges when the pulse causes the current to flow in the device under test and the sensor determines the current in the device under test as the capacitor discharges.

Example 3 is the test and measurement circuit of either Example 1 or 2, wherein the pulse generator is configured to generate the pulse at a predetermined voltage.

Example 4 is the test and measurement circuit of any of Examples 1 to 3, wherein the direct current voltage source charges the capacitor to a predetermined level based on the device under test.

Example 5 is the test and measurement circuit of any of Examples 1 to 4, wherein the pulse is received at a control terminal of the device under test.

Example 6 is the test and measurement circuit of any of Examples 1 to 5, further comprising a switch, wherein the switch is configured to receive the pulse from the pulse generator to discharge the capacitor.

Example 7 is the test and measurement circuit of Example 6, wherein the pulse is received at a control terminal of the switch.

Example 8 is the test and measurement circuit of any of Examples 1 to 7, wherein the sensor comprises a resistor.

Example 9 is a test and measurement instrument, comprising the measurement circuit of any of Examples 1 to 8; and a measurement device configured to measure the current through the sensor.

Example 10 is the test and measurement instrument of Example 9, wherein the measurement device is further configured to measure a voltage of the device under test simultaneously with measuring the current through the sensor, wherein the measured current through the sensor substantially represents the current in the device under test.

Example 11 is a method for characterizing a device under test, comprising charging a capacitor by a direct current voltage source; generating a pulse by a pulse generator for testing the device under test; and measuring a current through the device under test based on the pulse.

Example 12 is the method of Example 11, wherein the capacitor discharges when the pulse is received at the device under test and the method further includes measuring the current through the device under test as the capacitor discharges.

Example 13 is the method of Example 11 or 12, wherein the pulse is generated at a predetermined voltage.

Example 14 is the method of any of Examples 11 to 13, wherein the direct current voltage source charges the capacitor to a predetermined level based on the device under test.

Example 15 is the method of any of Examples 11 to 14, further comprising receiving the pulse at a control terminal of the device under test.

Example 16 is the method of any of Examples 11 to 15, further comprising receiving the pulse from the pulse generator at a switch to discharge the capacitor.

Example 17 is the method of any of Examples 11 to 16, wherein the pulse is received at a control terminal of the switch.

Example 18 is the method of any of Examples 11 to 17, wherein the current is measured using a resistor in series with the device under test.

Example 19 is the method of any of Examples 11 to 18, wherein the current is measured through the resistor as the capacitor discharges.

Example 20 is the method of Example 19, further comprising measuring a voltage of the device under test simultaneously with measuring the current.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement circuit, comprising:
   a capacitor in parallel with a device under test and structured to discharge through the device under test during a testing period to characterize the device;
   a direct current voltage source configured to charge the capacitor;
   a pulse generator configured to generate a pulse for testing the device under test during the testing period; and
   a sensor for determining a current in the device under test sourced from the capacitor.

2. The test and measurement circuit of claim 1, wherein the capacitor discharges through the device under test when the pulse causes the current to flow in the device under test and the sensor determines the current in the device under test as the capacitor discharges.

3. The test and measurement circuit of claim 1, wherein the pulse generator is configured to generate the pulse at a predetermined voltage.

4. The test and measurement circuit of claim 1, wherein the direct current voltage source charges the capacitor to a predetermined level based on the device under test.

5. The test and measurement circuit of claim 1, wherein the pulse is received at a control terminal of the device under test.

6. The test and measurement circuit of claim 1, further comprising a switch coupled between one terminal of the capacitor and one terminal of the device under test, wherein the switch is configured to receive the pulse from the pulse generator to discharge the capacitor.

7. The test and measurement circuit of claim 6, wherein the pulse is received at a control terminal of the switch.

8. The test and measurement circuit of claim 1, wherein the sensor comprises a resistor.

9. A test and measurement instrument, comprising:
   the measurement circuit of claim 1; and
   a measurement device configured to measure the current through the sensor.

10. The test and measurement instrument of claim 9, wherein the measurement device is further configured to measure a voltage of the device under test simultaneously with measuring the current through the sensor, wherein the measured current through the sensor substantially represents the current in the device under test.

11. A method for characterizing a device under test, comprising:
    charging a capacitor by a direct current voltage source;

generating a pulse by a pulse generator for testing the device under test discharging the capacitor through the device under test when the pulse is generated; and measuring a current sourced from the capacitor through the device under test based on the pulse.

12. The method of claim 11, wherein the capacitor discharges when the pulse is received at the device under test and the method further includes measuring the current through the device under test as the capacitor discharges.

13. The method of claim 11, wherein the pulse is generated at a predetermined voltage.

14. The method of claim 11, wherein the direct current voltage source charges the capacitor to a predetermined level based on the device under test.

15. The method of claim 11, further comprising receiving the pulse at a control terminal of the device under test.

16. The method of claim 11, further comprising receiving the pulse from the pulse generator at a switch disposed between a terminal of the capacitor and a terminal of the device under test to discharge the capacitor.

17. The method of claim 16, wherein the pulse is received at a control terminal of the switch.

18. The method of claim 11, wherein the current is measured using a resistor in series with the device under test.

19. The method of claim 18, wherein the current is measured through the resistor as the capacitor discharges.

20. The method of claim 19, further comprising measuring a voltage of the device under test simultaneously with measuring the current.

\* \* \* \* \*